US010679685B2

(12) United States Patent
Hoang et al.

(10) Patent No.: US 10,679,685 B2
(45) Date of Patent: Jun. 9, 2020

(54) SHARED BIT LINE ARRAY ARCHITECTURE FOR MAGNETORESISTIVE MEMORY

(71) Applicant: SPIN MEMORY, Inc., Fremont, CA (US)

(72) Inventors: Loc Hoang, Fremont, CA (US); Amitay Levi, Fremont, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 15/855,660

(22) Filed: Dec. 27, 2017

(65) Prior Publication Data

US 2019/0198078 A1    Jun. 27, 2019

(51) Int. Cl.
*G11C 11/16*    (2006.01)
*H01L 27/22*    (2006.01)
*H01L 43/02*    (2006.01)

(52) U.S. Cl.
CPC ........ *G11C 11/1659* (2013.01); *G11C 11/161* (2013.01); *G11C 11/1653* (2013.01); *G11C 11/1655* (2013.01); *G11C 11/1657* (2013.01); *G11C 11/1673* (2013.01); *G11C 11/1675* (2013.01); *H01L 27/228* (2013.01); *H01L 43/02* (2013.01); *G11C 2213/79* (2013.01); *G11C 2213/82* (2013.01)

(58) Field of Classification Search
CPC .............. G11C 11/1659; G11C 11/161; G11C 11/1655; G11C 11/1657; H01L 27/228; H01L 43/02
USPC ........................................................ 365/158
See application file for complete search history.

(56) References Cited

U.S. PATENT DOCUMENTS

| 5,541,868 | A | 7/1996 | Prinz |
| 5,629,549 | A | 5/1997 | Johnson |
| 5,640,343 | A | 6/1997 | Gallagher et al. |
| 5,654,566 | A | 8/1997 | Johnson |
| 5,691,936 | A | 11/1997 | Sakakima et al. |
| 5,695,846 | A | 12/1997 | Lange et al. |
| 5,695,864 | A | 12/1997 | Slonczewski |
| 5,732,016 | A | 3/1998 | Chen et al. |
| 5,856,897 | A | 1/1999 | Mauri |
| 5,896,252 | A | 4/1999 | Kanai |
| 5,966,323 | A | 10/1999 | Chen et al. |
| 6,016,269 | A | 1/2000 | Peterson et al. |
| 6,055,179 | A | 4/2000 | Koganei et al. |
| 6,097,579 | A | 8/2000 | Gill |
| 6,124,711 | A | 9/2000 | Tanaka et al. |

(Continued)

FOREIGN PATENT DOCUMENTS

| CA | 2766141 | 1/2011 |
| CN | 105706259 | 6/2016 |

(Continued)

*Primary Examiner* — Xiaochun L Chen (57) ABSTRACT

A magnetoresistive memory architecture in one aspect includes a plurality of bit lines each coupled to two or more respective columns of magnetoresistive memory cells, and a plurality of source lines each coupled to a respective one of the columns of memory cells. A given memory cell can be accessed by biasing a selected word line, a selected bit line, and a selected source line coupled to corresponding column of memory cells coupled to the selected bit line, and by counter biasing one or more selected source lines coupled to one or more other columns of memory cells coupled to the selected bit line.

20 Claims, 5 Drawing Sheets

(56) References Cited

U.S. PATENT DOCUMENTS

| | | | |
|---|---|---|---|
| 6,134,138 A | 10/2000 | Lu et al. | |
| 6,140,838 A | 10/2000 | Johnson | |
| 6,154,139 A | 11/2000 | Kanai et al. | |
| 6,172,902 B1 | 1/2001 | Wegrowe et al. | |
| 6,233,172 B1 | 5/2001 | Chen et al. | |
| 6,243,288 B1 | 6/2001 | Ishikawa et al. | |
| 6,252,798 B1 | 6/2001 | Satoh et al. | |
| 6,256,223 B1 | 7/2001 | Sun | |
| 6,292,389 B1 | 9/2001 | Chen et al. | |
| 6,347,049 B1 | 2/2002 | Childress et al. | |
| 6,376,260 B1 | 4/2002 | Chen et al. | |
| 6,385,082 B1 | 5/2002 | Abraham et al. | |
| 6,436,526 B1 | 8/2002 | Odagawa et al. | |
| 6,458,603 B1 | 10/2002 | Kersch et al. | |
| 6,493,197 B2 | 12/2002 | Ito et al. | |
| 6,522,137 B1 | 2/2003 | Sun et al. | |
| 6,532,164 B2 | 3/2003 | Redon et al. | |
| 6,538,918 B2 | 3/2003 | Swanson et al. | |
| 6,545,906 B1 | 4/2003 | Savtchenko et al. | |
| 6,563,681 B1 | 5/2003 | Sasaki et al. | |
| 6,566,246 B1 | 5/2003 | deFelipe et al. | |
| 6,603,677 B2 | 8/2003 | Redon et al. | |
| 6,653,153 B2 | 11/2003 | Doan et al. | |
| 6,654,278 B1 | 11/2003 | Engel et al. | |
| 6,677,165 B1 | 1/2004 | Lu et al. | |
| 6,710,984 B1 | 3/2004 | Yuasa et al. | |
| 6,713,195 B2 | 3/2004 | Wang et al. | |
| 6,714,444 B2 | 3/2004 | Huai et al. | |
| 6,744,086 B2 | 6/2004 | Daughton et al. | |
| 6,750,491 B2 | 6/2004 | Sharma et al. | |
| 6,765,824 B2 | 7/2004 | Kishi et al. | |
| 6,772,036 B2 | 8/2004 | Eryurek et al. | |
| 6,773,515 B2 | 8/2004 | Li et al. | |
| 6,777,730 B2 | 8/2004 | Daughton et al. | |
| 6,812,437 B2 | 11/2004 | Levy et al. | |
| 6,829,161 B2 | 12/2004 | Huai et al. | |
| 6,835,423 B2 | 12/2004 | Chen et al. | |
| 6,838,740 B2 | 1/2005 | Huai et al. | |
| 6,842,317 B2 | 1/2005 | Sugita et al. | |
| 6,847,547 B2 | 1/2005 | Albert et al. | |
| 6,887,719 B2 | 5/2005 | Lu et al. | |
| 6,888,742 B1 | 5/2005 | Nguyen et al. | |
| 6,902,807 B1 | 6/2005 | Argoitia et al. | |
| 6,906,369 B2 | 6/2005 | Ross et al. | |
| 6,920,063 B2 | 7/2005 | Huai et al. | |
| 6,933,155 B2 | 8/2005 | Albert et al. | |
| 6,958,927 B1 | 10/2005 | Nguyen et al. | |
| 6,967,863 B2 | 11/2005 | Huai | |
| 6,980,469 B2 | 12/2005 | Kent et al. | |
| 6,985,385 B2 | 1/2006 | Nguyen et al. | |
| 6,992,359 B2 | 1/2006 | Nguyen et al. | |
| 6,995,962 B2 | 2/2006 | Saito et al. | |
| 7,002,839 B2 | 2/2006 | Kawabata et al. | |
| 7,005,958 B2 | 2/2006 | Wan | |
| 7,006,375 B2 | 2/2006 | Covington | |
| 7,009,877 B1 | 3/2006 | Huai et al. | |
| 7,041,598 B2 | 5/2006 | Sharma | |
| 7,045,368 B2 | 5/2006 | Hong et al. | |
| 7,170,778 B2 | 1/2007 | Kent et al. | |
| 7,190,611 B2 | 3/2007 | Nguyen et al. | |
| 7,203,129 B2 | 4/2007 | Lin et al. | |
| 7,227,773 B1 | 6/2007 | Nguyen et al. | |
| 7,262,941 B2 | 8/2007 | Li et al. | |
| 7,307,876 B2 | 12/2007 | Kent et al. | |
| 7,335,960 B2 | 2/2008 | Han et al. | |
| 7,351,594 B2 | 4/2008 | Bae et al. | |
| 7,352,021 B2 | 4/2008 | Bae et al. | |
| 7,376,006 B2 | 5/2008 | Bednorz et al. | |
| 7,449,345 B2 | 11/2008 | Horng et al. | |
| 7,476,919 B2 | 1/2009 | Hong et al. | |
| 7,573,737 B2 | 8/2009 | Kent et al. | |
| 7,619,431 B2 | 11/2009 | DeWilde et al. | |
| 7,911,832 B2 | 3/2011 | Kent et al. | |
| 7,936,595 B2 | 5/2011 | Han et al. | |
| 7,986,544 B2 | 7/2011 | Kent et al. | |
| 8,279,666 B2 | 10/2012 | Dieny et al. | |
| 8,334,213 B2 | 12/2012 | Mao | |
| 8,363,465 B2 | 1/2013 | Kent et al. | |
| 8,492,881 B2 | 7/2013 | Kuroiwa et al. | |
| 8,535,952 B2 | 9/2013 | Ranjan et al. | |
| 8,574,928 B2 | 11/2013 | Satoh et al. | |
| 8,617,408 B2 | 12/2013 | Balamane | |
| 8,716,817 B2 | 5/2014 | Saida | |
| 8,737,137 B1 | 5/2014 | Choy et al. | |
| 9,025,367 B1* | 5/2015 | Lin | G11C 11/1673 365/158 |
| 9,082,888 B2 | 7/2015 | Kent et al. | |
| 9,263,667 B1 | 2/2016 | Pinarbasi | |
| 9,406,876 B2 | 8/2016 | Pinarbasi | |
| 9,583,166 B2* | 2/2017 | Gharia | G11C 11/161 |
| 9,853,206 B2* | 12/2017 | Pinarbasi | H01L 43/08 |
| 10,163,479 B2* | 12/2018 | Berger | G11C 11/1677 |
| 2002/0090533 A1 | 7/2002 | Zhang et al. | |
| 2002/0105823 A1 | 8/2002 | Redon et al. | |
| 2003/0117840 A1 | 6/2003 | Sharma et al. | |
| 2003/0151944 A1 | 8/2003 | Saito | |
| 2003/0197984 A1 | 10/2003 | Inomata et al. | |
| 2003/0218903 A1 | 11/2003 | Luo | |
| 2004/0012994 A1 | 1/2004 | Slaughter et al. | |
| 2004/0061154 A1 | 4/2004 | Huai et al. | |
| 2004/0094785 A1 | 5/2004 | Zhu et al. | |
| 2004/0130936 A1 | 7/2004 | Nguyen et al. | |
| 2004/0257717 A1 | 12/2004 | Sharma et al. | |
| 2005/0041342 A1 | 2/2005 | Huai et al. | |
| 2005/0051820 A1 | 3/2005 | Stojakovic et al. | |
| 2005/0063222 A1 | 3/2005 | Huai et al. | |
| 2005/0104101 A1 | 5/2005 | Sun et al. | |
| 2005/0128842 A1 | 6/2005 | Wei | |
| 2005/0136600 A1 | 6/2005 | Huai | |
| 2005/0158881 A1 | 7/2005 | Sharma | |
| 2005/0180202 A1 | 8/2005 | Huai et al. | |
| 2005/0184839 A1 | 8/2005 | Nguyen et al. | |
| 2005/0201023 A1 | 9/2005 | Huai et al. | |
| 2005/0237787 A1 | 10/2005 | Huai et al. | |
| 2005/0280058 A1 | 12/2005 | Pakala et al. | |
| 2006/0018057 A1 | 1/2006 | Huai | |
| 2006/0049472 A1 | 3/2006 | Diao et al. | |
| 2006/0087880 A1 | 4/2006 | Mancoff et al. | |
| 2006/0092696 A1 | 5/2006 | Bessho | |
| 2006/0132990 A1 | 6/2006 | Morise et al. | |
| 2006/0227465 A1 | 10/2006 | Inokuchi et al. | |
| 2007/0019337 A1 | 1/2007 | Apalkov et al. | |
| 2007/0242501 A1 | 10/2007 | Hung et al. | |
| 2008/0043514 A1* | 2/2008 | Ueda | G11C 7/02 365/148 |
| 2008/0049488 A1 | 2/2008 | Rizzo | |
| 2008/0112094 A1 | 5/2008 | Kent et al. | |
| 2008/0151614 A1 | 6/2008 | Guo | |
| 2008/0259508 A2 | 10/2008 | Kent et al. | |
| 2008/0297292 A1 | 12/2008 | Viala et al. | |
| 2009/0046501 A1 | 2/2009 | Ranjan et al. | |
| 2009/0072185 A1 | 3/2009 | Raksha et al. | |
| 2009/0091037 A1 | 4/2009 | Assefa et al. | |
| 2009/0098413 A1 | 4/2009 | Kanegae | |
| 2009/0161421 A1 | 6/2009 | Cho et al. | |
| 2009/0209102 A1 | 8/2009 | Zhong et al. | |
| 2009/0231909 A1 | 9/2009 | Dieny et al. | |
| 2010/0124091 A1 | 5/2010 | Cowburn | |
| 2010/0193891 A1 | 8/2010 | Wang et al. | |
| 2010/0246254 A1 | 9/2010 | Prejbeanu et al. | |
| 2010/0271870 A1 | 10/2010 | Zheng et al. | |
| 2010/0290275 A1 | 11/2010 | Park et al. | |
| 2011/0032645 A1 | 2/2011 | Noel et al. | |
| 2011/0058412 A1 | 3/2011 | Zheng et al. | |
| 2011/0089511 A1 | 4/2011 | Keshtbod et al. | |
| 2011/0133298 A1 | 6/2011 | Chen et al. | |
| 2012/0052258 A1 | 3/2012 | Op DeBeeck et al. | |
| 2012/0069649 A1 | 3/2012 | Ranjan et al. | |
| 2012/0280336 A1 | 6/2012 | Watts | |
| 2012/0181642 A1 | 7/2012 | Prejbeanu et al. | |
| 2012/0188818 A1 | 7/2012 | Ranjan et al. | |
| 2012/0280339 A1 | 11/2012 | Zhang et al. | |
| 2012/0294078 A1 | 11/2012 | Kent et al. | |
| 2012/0299133 A1 | 11/2012 | Son et al. | |

(56) References Cited

U.S. PATENT DOCUMENTS

| | | |
|---|---|---|
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0244344 A1 | 9/2013 | Malmhall et al. |
| 2013/0267042 A1 | 10/2013 | Satoh et al. |
| 2013/0270661 A1 | 10/2013 | Yi et al. |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0042571 A1 | 2/2014 | Gan et al. |
| 2014/0070341 A1 | 3/2014 | Beach et al. |
| 2014/0103472 A1 | 4/2014 | Kent et al. |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0264671 A1 | 9/2014 | Chepulskyy et al. |
| 2014/0340958 A1* | 11/2014 | Gharia .................. G11C 11/161 365/158 |
| 2015/0056368 A1 | 2/2015 | Wang et al. |
| 2016/0087193 A1 | 3/2016 | Pinarbasi et al. |
| 2016/0163973 A1 | 6/2016 | Pinarbasi |
| 2016/0372518 A1* | 12/2016 | Li ........................ G11C 11/1659 |
| 2016/0372656 A1* | 12/2016 | Pinarbasi ................ H01L 43/08 |
| 2017/0047107 A1* | 2/2017 | Berger ................ G11C 11/1677 |

FOREIGN PATENT DOCUMENTS

| | | |
|---|---|---|
| EP | 1345277 | 9/2003 |
| FR | 2817998 | 6/2002 |
| FR | 2832542 | 5/2003 |
| FR | 2910716 | 6/2008 |
| JP | H10-004012 | 1/1998 |
| JP | H11-120758 | 4/1999 |
| JP | H11-352867 | 12/1999 |
| JP | 2001-195878 | 7/2001 |
| JP | 2002-261352 | 9/2002 |
| JP | 2002-357489 | 12/2002 |
| JP | 2003-318461 | 11/2003 |
| JP | 2005-044848 | 2/2005 |
| JP | 2005-150482 | 6/2005 |
| JP | 2005-535111 | 11/2005 |
| JP | 2006128579 | 5/2006 |
| JP | 2008-524830 | 7/2008 |
| JP | 2009-027177 | 2/2009 |
| JP | 2013-012546 | 1/2013 |
| JP | 2014-039061 | 2/2014 |
| JP | 5635666 | 12/2014 |
| JP | 2015-002352 | 1/2015 |
| KR | 10-2014-015246 | 9/2014 |
| WO | 2009-080636 | 7/2009 |
| WO | 2011-005484 | 1/2011 |
| WO | 2014-062681 | 4/2014 |

* cited by examiner

SHARED BIT LINE ARRAY ARCHITECTURE FOR MAGNETORESISTIVE MEMORY

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, game consoles, servers, distributed computing systems, and the like have facilitated increased productivity and reduced costs in communicating and analyzing data in most areas of entertainment, education, business, and science. One common aspect of computing systems is the computing device readable memory. Computing devices may include one or more types of memory, such as volatile random-access memory, non-volatile flash memory, and the like.

An emerging non-volatile memory technology is Magnetoresistive Random Access Memory (MRAM). In MRAM devices, data can be stored in the magnetization orientation between ferromagnetic layers. Typically, if the ferromagnetic layers have the same magnetization polarization, the cell will exhibit a relatively low resistance value corresponding to a '0' bit state; while if the magnetization polarization between the two ferromagnetic layers is antiparallel the memory cell will exhibit a relatively high resistance value corresponding to a '1' bit state. Because the data is stored in the magnetic fields, MRAM devices are non-volatile memory devices. The state of a MRAM cell can be read by applying a predetermined current through the cell and measuring the resulting voltage, or by applying a predetermined voltage across the cell and measuring the resulting current. The sensed current or voltage is proportional to the resistance of the cell and can be compared to a reference value to determine the state of the cell.

MRAM devices are characterized by densities similar to Dynamic Random-Access Memory (DRAM), power consumption similar to flash memory, and speed similar to Static Random-Access Memory (SRAM). However, similar to other memory types, there is a continuing need to achieve further device scaling of MRAM devices and/or reduce device defects.

SUMMARY OF THE INVENTION

The present technology may best be understood by referring to the following description and accompanying drawings that are used to illustrate embodiments of the present technology that are directed toward a shared bit line architecture for magnetoresistive memory.

In one embodiment, a memory device can include a plurality of memory cells, a plurality of bit lines, a plurality of source lines, a plurality of word lines, and a control circuit. The plurality of memory cells can be arranged in a plurality of rows and a plurality of columns. Each memory cell can include a Magnetic Tunneling Junction (MTJ) and a transistor, wherein a drain of the transistor can be coupled to a first terminal of the MTJ. Each bit line can be coupled to a second terminal of the MTJs in two or more respective columns of the memory cells. Each source line can be coupled to a source of the transistors of the memory cells in a respective column of the memory cells. Each word line can be coupled to a gate of the transistors of the memory cells in a respective row of the memory cells. The control circuit can be configured to apply corresponding biases to a select word line, a select bit line and a select source line coupled to the select bit line, and to apply a corresponding counter bias to one or more other source lines coupled to the select bit line to write a given value to a given memory cell.

In another embodiment, a Magnetoresistive Random-Access Memory (MRAM) can include a memory cell array and a control circuit. The memory cell array can include a plurality of magnetoresistive memory cells arranged in a plurality of columns and rows. The memory cell array can also include a plurality of word lines, a plurality of bit lines and a plurality of source lines. In the memory cell array, a word line can be coupled to a row of the magnetoresistive memory cells, a bit line can be coupled to a first and second column of the magnetoresistive memory cells, a first source line can be coupled to the first column of magnetoresistive memory cells, and a second source line can be coupled to the second column magnetoresistive memory cells. The control circuit can be configured to bias the word line, bias the bit lines, bias the first source line and counter bias the second source line to access a given magnetoresistive memory cell.

In one example, the control circuit can bias the word line at a word line write voltage, bias the bit line at a bit line write voltage, bias the first source line at a ground voltage and bias the second source line at the bit line write voltage to write a '0' state to the given memory cell. To write a '1' state to the given memory cell, the control circuit can bias the word line at a word line write voltage, bias the bit line at a ground voltage, bias the first source line at a source line write voltage, and bias the second source line at the ground voltage. In another example, the control circuit can bias the word line at a word line read voltage, bias the bit line a bit line read voltage, bias the first source line at a ground voltage, and bias the second source line at the bit line read voltage to read the state of the given memory cell using the first source line. In yet another example, the control circuit can bias the word line at a word line read voltage, bias the bit line a ground voltage, bias the first source line at a source line read voltage, and bias the second source line at the ground voltage to read the state of the given memory cell using the bit line.

In another embodiment, a method of accessing a MRAM can include biasing a selected word line coupled to a row of a plurality of MTJ memory cells. To access a given MTJ memory cell, the method can also include biasing a selected bit line coupled to a first and second column of the plurality of MTJ memory cells, wherein the first column of the plurality of MTJ memory cells includes the given MTJ memory cell. The method can also include biasing a selected source line coupled to the first column of the plurality of MTJ memory cells including the given MTJ memory cell. The method can also include counter biasing selected source line coupled to the second column of the plurality of MTJ memory cells.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Figure 1:
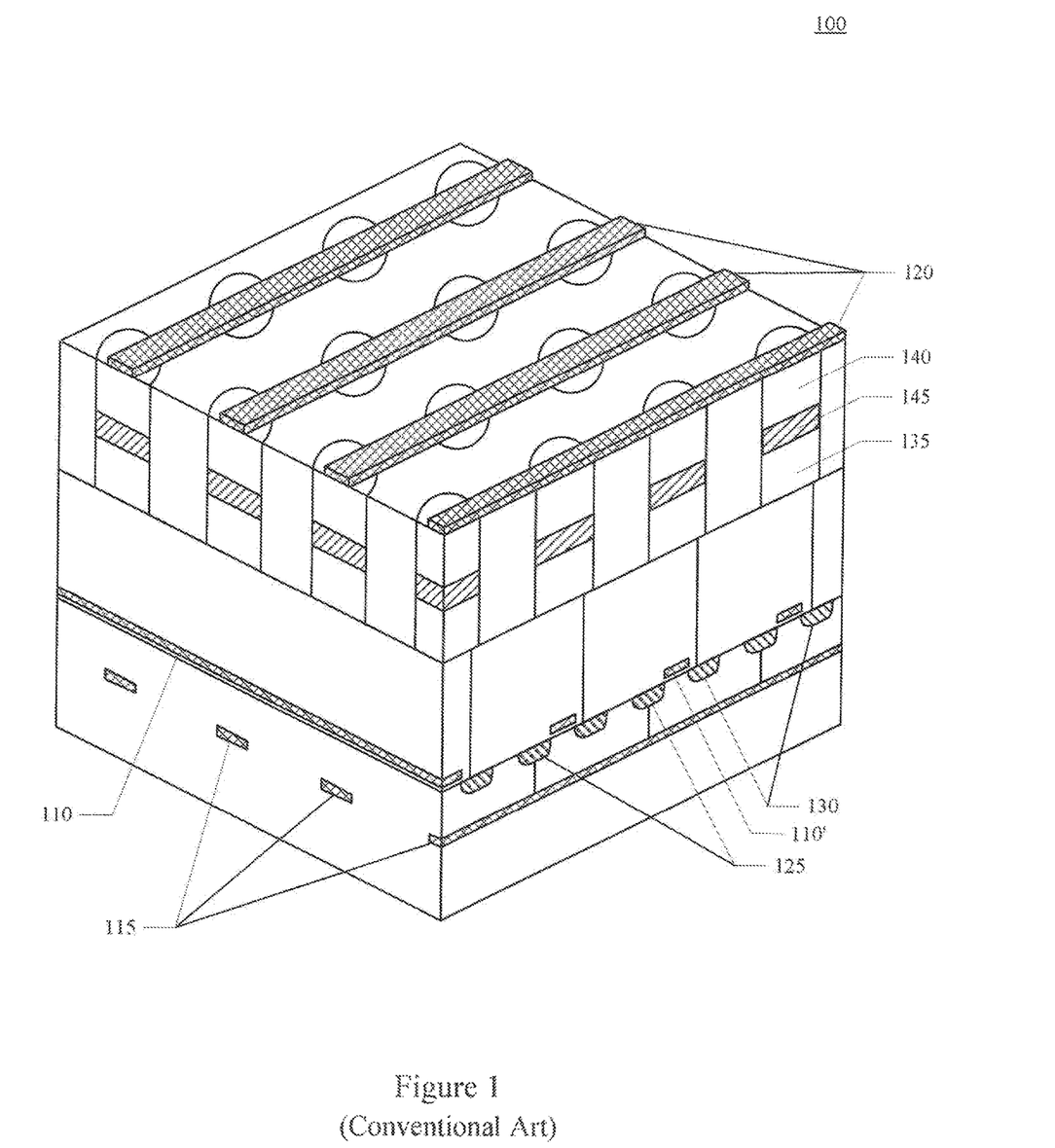
FIG. 1 shows an isometric representation of a Magnetoresistive Random Access Memory (MRAM) cell array, in accordance with the conventional art.

Before describing embodiments of the present technology in detail, a description of conventional MRAM devices is provided for reference. Referring to FIG. 1, an isometric representation of a MRAM cell array, in accordance with the conventional art, is shown. The MRAM cell array 100 can include a plurality of memory cells organized in rows and columns, with sets of word lines 110, source lines 115 and bit lines 120. Each memory cell can include a Magnetic Tunneling Junction (MTJ) and an access transistor arranged in columns and rows. The access transistors can each include a source region 125, a drain region 130, a body region, a gate region 110' and a gate insulator region. The source regions 125 in each column of access transistors can be coupled to a respective source line 115. The gate regions 110' in each row of access transistors can be coupled to a respective word line 110, or the gate regions 110' can be integrally formed with the word lines 110 as illustrated in the figure. The drain regions 130 of the access transistors can be coupled to respective MTJs. Each MTJ can include a reference magnetic layer 135, a free magnetic layer 140 and a magnetic tunneling barrier layer 145 disposed between the reference magnetic layer 135 and the free magnetic layer 140. The free magnetic layer 140 in each column can be coupled to a respective bit line 120.

The magnetic polarity of the free layer 140, and corresponding logic state, can be changed to one of two states depending upon the direction of current flowing through the MTJ of the memory cells. For example, a logic '0' state can be written to a given cell by biasing the respective bit line at a bit line write potential (e.g., $V_{BLW}$), biasing the respective source line at a ground potential, and biasing the respective word line at a word line write potential (e.g., $V_{WLW}$) A logic '1' state can be written to the given cell by biasing the respective bit line at a ground potential, biasing the respective source line at a source line write potential (e.g., $V_{SLW}$), and biasing the respective word line at a word line write potential (e.g., $V_{WLW}$) The state of the memory cell can be read by biasing the respective bit line at a bit line read potential (e.g., VBLR), biasing the respective source line at a ground potential, biasing the respective word line at a word line read potential (VWLR), and sensing the resulting current on the respective bit line.

In another example, a logic '0' state can be written to a given cell by biasing the respective bit line at a bit line write potential (e.g., $V_{BLW}$), biasing the respective source line at a ground potential, and biasing the respective word line at a word line write potential (e.g., $V_{WLW}$). A logic '1' state can be written to the given cell by biasing the respective bit line at a ground potential, biasing the respective source line at a source line write potential (e.g., $V_{SLW}$), and biasing the respective word line at a word line write potential (e.g., $V_{WLW}$). The state of the memory cell can be read by biasing the respective bit line at a ground potential, biasing the respective source line at a source line read potential (e.g., $V_{SLR}$), biasing the respective word line at a word line read potential (e.g., $V_{WLR}$), and sensing the resulting current on the respective source line.

Figure 2:
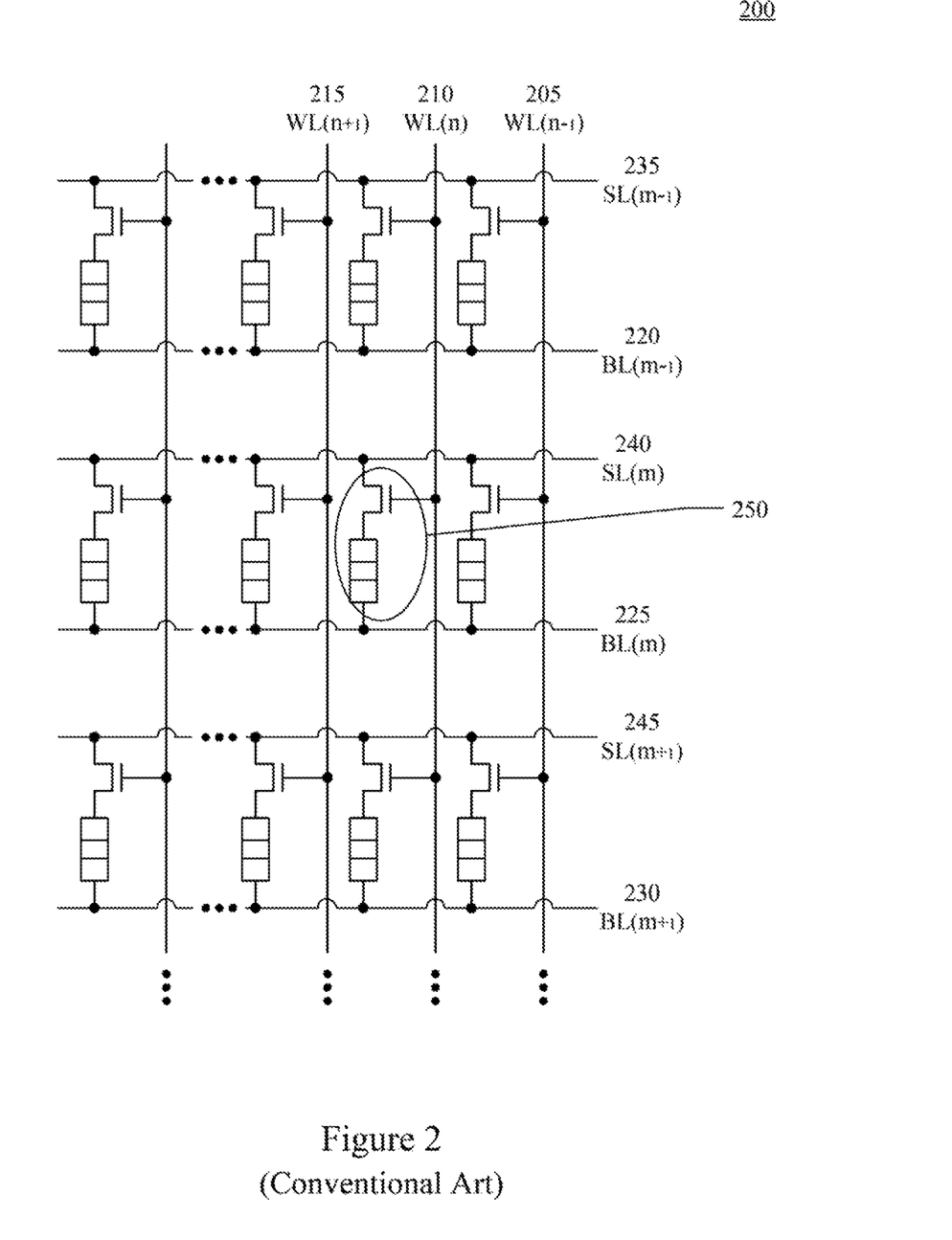
FIG. 2 shows a circuit diagram of a MRAM cell array, in accordance with the conventional art.

Referring now to FIG. 2, a circuit diagram of a MRAM memory cell array, in accordance with the conventional art, is shown. Again, the memory cell array 200 can include a plurality of memory cells 250, a plurality of word lines 205-215, a plurality of bit lines 220-230 and a plurality of source lines 235-245. The word lines 205-215 of the memory cell array 200 can be organized along columns of the array. The bit lines 220-230 and source lines 235-245 can be organized along rows of the array. Each memory cell 250 can comprise a Magnetic Tunneling Junction (MTJ) and an access transistor. The gates of the access transistors arranged along columns of the array can be coupled to respective word lines. The sources of the access transistors arranged along rows of the array can be coupled to respective source lines. The free magnetic layer of the MTJ arranged along rows of the array can be coupled to a respective bit line.

In one example, to read data from a given memory cell 250, the respective bit line BL(m) 225 can be biased at a bit line read potential (e.g., $V_{BLR}$) and the respective source line SL(m) 240 can be biased at ground (e.g., 0). When the respective word line WL(n) 210 is biased at a word line read voltage potential (e.g., $V_{WLR}$) a current proportional to the resistance of the MTJ of the cell 250 will flow from the respective bit line BL(m) 225 to the respective source line SL(m) 240. In such case, the current sensed on the respective bit line BL(m) 225 can indicate the state of the selected cell 250.

To write a logic '0' state to the given memory cell 250, the respective bit line BL(m) 225 can be biased at a bit line write potential (e.g., $V_{BLW}$) and the respective source line SL(m) 240 can be biased at ground (e.g., 0), When the respective word line WL(n) 210 is biased at a word line write potential (e.g., $V_{WLW}$), a resulting current flowing through the MTJ of the cell 250 in a first direction will cause the free layer into a state corresponding to a logic '0' state. To write a logic '1' state to the given memory cell 250, the respective bit line BL(m) 225 can be biased at ground (e.g., 0) and the respective source line SL(m) 240 can be biased at a source line write potential (e.g., $V_{SLW}$). When the respective word line WL(n) 210 is biased at a word line write potential (e.g., $V_{WLW}$) a resulting current flowing through the MTJ of the cell 250 in a second direction will cause the free layer into a state corresponding to a logic '1' state.

To write a logic '0' state to the given memory cell 250, the respective bit line BL(m) 225 can be biased at a bit line write potential $V_{BLW}$) and the respective source line SL(m) 240 can be biased at ground (e.g., 0). When the respective word line WL(n) 210 is biased at a word line write potential (e.g., $V_{WLW}$), a resulting current flowing through the MTJ of the cell 250 in a first direction will cause the free layer into a logic '0' state. To write a logic '1' state to a given memory cell 250, the respective bit line BL(m) 225 can be biased at ground (e.g., 0) and the respective source line SL(m) 240 can be biased at a source line write potential (e.g., $V_{SLW}$). When the respective word line WL(n) 245 is biased at a word line write state (e.g., $V_{WLW}$) a resulting current flowing through the MTJ of the cell 250 in a second direction will cause the free layer into a logic '1' state.

To write a logic '0' state to the given memory cell 250, the respective bit line BL(m) 225 can be biased at a bit line write potential (e.g., $V_{BLW}$) and the respective source line SL(m) 240 can be biased at ground (e.g., 0). When the respective word line WL(n) 210 is biased at a word line write potential (e.g., $V_{WLW}$) a resulting current flowing through the MTJ of the cell 250 in a first direction will cause the free layer into a logic '0' state. To write a logic '1' state to a given memory cell 250, the respective bit line BL(m) 225 can be biased at ground (e.g., 0) and the respective source line SL(m) 240 can be biased at a source line write potential (e.g., $V_{SLW}$). When the respective word line WL(n) 245 is biased at a word line write state (e.g., $V_{WLW}$) a resulting current flowing through the MTJ of the cell 250 in a second direction will cause the free layer into a logic '1' state.

Figure 3:
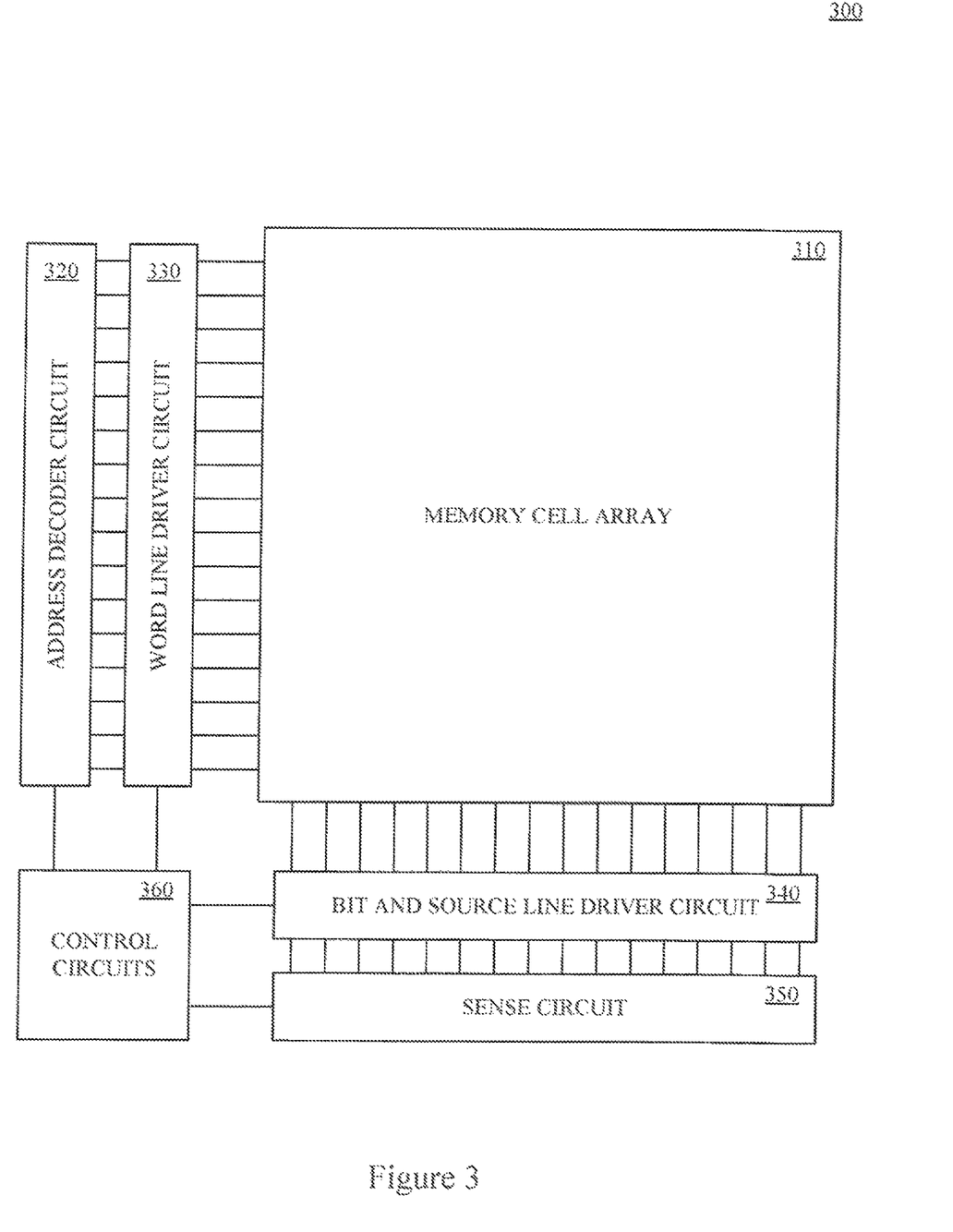
FIG. 3 shows a block diagram of a MRAM, in accordance with embodiments of the present technology.

Referring now to FIG. 3, a block diagram of a Magnetoresistive Random Access Memory (MRAM), in accordance with embodiments of the present technology, is shown. The MRAM 300 can include a memory cell array 310, an address decoder circuit 320, a word line driver circuit 330, a bit line and source line driver circuit 340, a sense circuit 350, and control circuit 360. The MRAM 300 can include other well-known circuits that are not necessary for an understanding of the present technology and therefore are not discussed herein.

The memory cell array 310 can include a plurality of memory cells organized in rows and columns, with sets of word lines, source lines and bit lines spanning the array of cells throughout the chip. The address decoder 320 can map a given memory address to a particular row of memory cells in the array. The output of the address decoder 320 can be input to the word line driver 330. The output of the word line driver 330 can drive the word lines to select a given word line of the array. The bit line and source line driver 340 and the sense circuit 350 utilize the source lines and bit lines of the array to read from and write to memory cells of a selected word line of the array.

In one implementation, the MRAM may be a Spin Transfer Torque Magnetoresistive Random Access Memory (STT-MRAM). In STT-MRAMs, spin-aligned electrons are utilized to switch the polarization state of the free magnetic layer. The spin transfer torque reduces the amount of current needed during writes.

Operation of the Magnetoresistive Random Access Memory (MRAM) 300 will be further explained with reference to FIG. 4, which shows an isometric representation of a memory cell array 310, in accordance with embodiments of the present technology. Again, the memory cell array 310 can include a plurality of memory cells organized in rows and columns, with sets of word lines, source lines and bit lines. The MRAM as illustrated is not to scale and does not show every element of the MRAM. Instead, the illustration includes an arrangement of elements that readily facilitate an understanding of embodiments of the present technology.

The memory cell array 310 can include a plurality of source lines 405 disposed in a semiconductor substrate 410. The source lines 405 can be formed by a deep implant into the semiconductor substrate 410 through one or more masks to form buried source lines therein. Each memory cell can include a Magnetic Tunneling Junction (MTJ) and an access transistor arranged in an array of columns and rows. The access transistors can each include a source region 415, a drain region 420, a body region, a gate region 425 and a gate insulator region. The source and drain regions 415, 420 can be disposed in the semiconductor substrate 410. The source and drain regions 415, 420 can be formed by a shallow implant into the semiconductor substrate 410 through one or more masks. The gate region 425 can be disposed above a body region, between the respective source and drain regions 415, 420. The gate insulator region can be disposed between the gate region 425 and the body, source and drain regions 415, 420. The gate insulator regions and gate regions 425 can be formed by depositing one or more dielectric layers on the substrate 405, and one or more conductive layers on the one or more dielectric layers and then selectively etching the one or more conductive layers and dielectric layers utilizing one or more masks to form the gate insulator regions and the gate regions 425. The source regions 415 in each column of access transistors can be coupled to a respective source line 405. The gate regions 425 in each row of access transistors can be coupled to a respective word line, or the gate regions 425 can be integrally formed with the word lines 425' as illustrated in the figure. The drain regions 420 of the access transistors can be coupled to respective MTJs.

Each MTJ can include a reference magnetic layer 430, a free magnetic layer 435 and a magnetic tunneling barrier layer 440 disposed between the reference magnetic layer 430 and the free magnetic layer 435. The MJTs can be formed by depositing one or more seed layers, one or more synthetic antiferromagnetic layers, one or more reference magnetic layers 430, one or more magnetic tunneling barrier layers 440, one or more free magnetic layers 435, one or more non-magnetic spacer layers, one or more perpendicular polarizer layers, one or more capping layers, one or more hard mask layers, and then using the patterned hard mask layers to etch the other layers to form MJT pillars. The reference magnetic layer 430 can be coupled to the drain region 420 of the respective access transistor. The free magnetic layer 435 of two or more columns of MTJs can be coupled to a respective bit line 445.

The bit lines 445 can be disposed in one or more layers above the MTJ, and the source lines 405 can be disposed in one or more layers below the access transistors, along columns of the array. The bit lines 445 and source lines 405 can be substantially parallel to each other. The word lines 425' can be disposed in one or more layers along rows of the array. The word lines 425' can be substantially parallel to each other, and substantially perpendicular to the bit lines 445 and source lines 405. Two or more columns of the memory cells can be coupled to a respective bit line 445. Coupling a plurality of columns of the memory cells to respective bit lines 445 reduces the number of bit line in the memory cell array 310. By reducing the number of bit lines, the width of the bit lines can be increased and/or the spacing between bit lines can be increased for the same process technology. The increased width of the bit lines can, for example, reduce the resistance in the bit lines, and/or make alignment with the columns of MTJs easier. The increased spacing between bit lines can, for example, reduce manufacturing defects due alignment with the columns of MTJs, or shorting between adjacent bit lines. By reducing the number of bit lines, the density of the memory cells in the array can be increased due to smaller possible column pitch dimension for the same process technology. Furthermore, the physical length of the word lines in the memory cell array 310 can be reduced due to the smaller column pitch dimension. The reduced word line length can, for example, reduce the resistance in the word lines.

Figure 4:
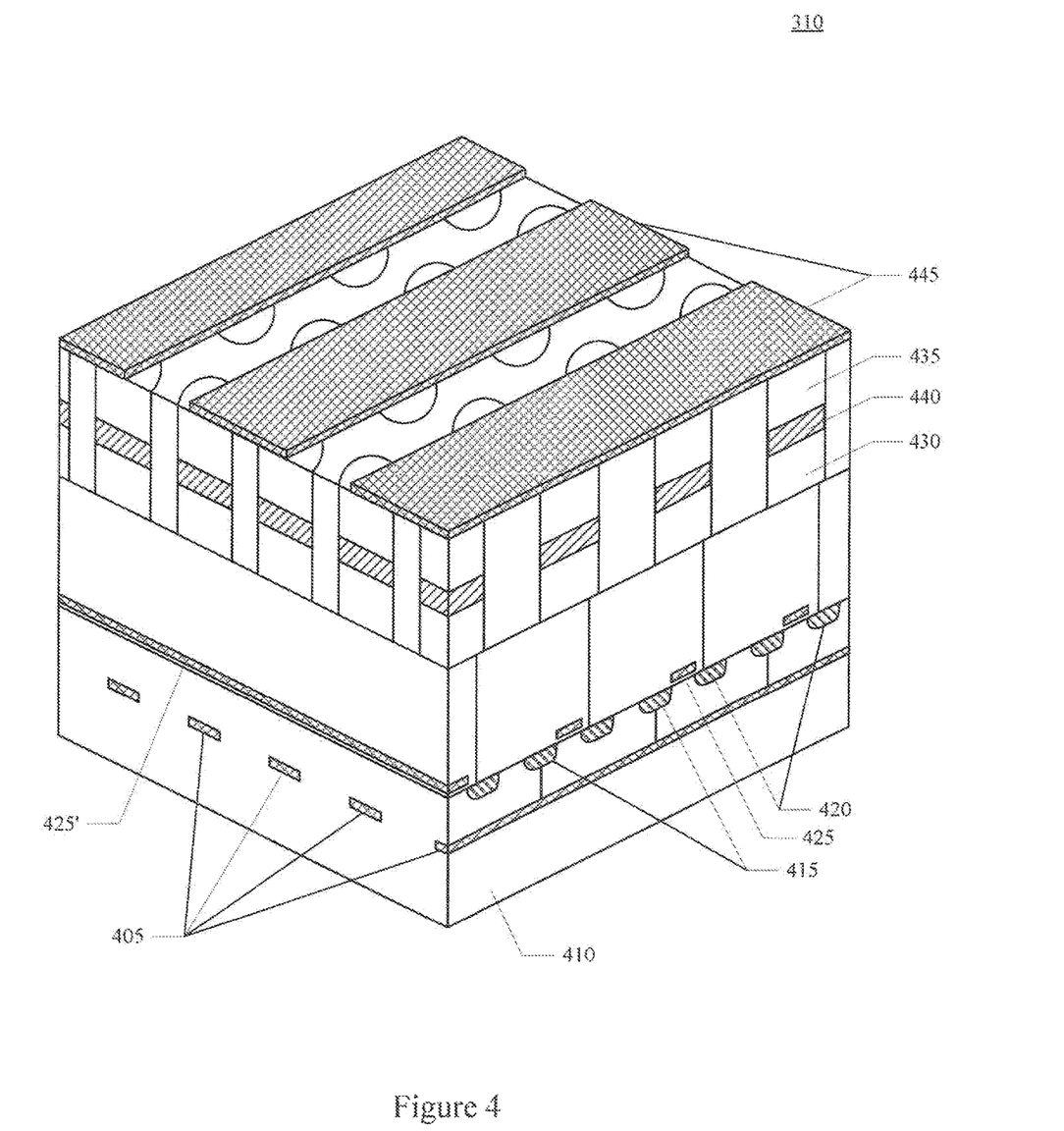
FIG. 4 shows an isometric representation of a MRAM cell array, in accordance with embodiments of the present technology.

Referring now to both FIGS. 3 and 4, the control circuit 360 can be configured to cause the bit line and source line driver circuit 340 to apply appropriate write voltages to bit lines 445, source lines 405 and word lines 425' to write data to cells in a selected word. The magnetic polarity, and corresponding logic state, of the free layer 435 of the MTJ can be changed to one of two states depending upon the direction of current flowing through the MTJ. A logic '0' state can be written to a given cell by counter biasing the unselected source lines corresponding to the respective bit line for the given cell, as will be explained in more detail below.

For read operations, the control circuit 360 can be configured to cause the bit line and source line driver circuit 340 to apply appropriate read voltages to the bit lines 445, sources lines 405 and word lines 425' to cause a current to flow in the source lines 405 that can be sensed by the sense circuit 350 to read data from cells in a selected word. For configurations that sense the bit lines to read the memory cell states, a given cell can be read by counter biasing the unselected source lines corresponding to the respective bit line for the given cell, as will be explained in more detail below.

Operation of the Magnetoresistive Random Access Memory (MRAM) will be further explained with reference to FIG. 5, which shows a circuit diagram of a MRAM cell array, in accordance with embodiments of the present technology. The MRAM cell array 310 can include a plurality of memory cells, word lines 505-515, bit lines 520-525 and source lines 530-545. The word lines 505-515 of the memory cell array 310 can be organized along columns of the array. The bit lines 520-525 and source lines 530-545 can be organized along rows of the array. Each memory cell 550, 555 can comprise a Magnetic Tunneling Junction (MTJ) and an access transistor. The gates of the access transistors arranged along columns of the array can be coupled to respective word lines. The sources of the access transistors arranged along rows of the array can be coupled to respective source lines. The free magnetic layer of the MTJ arranged along two or more rows of the array can be coupled to a respective one of the bit lines.

Figure 5:
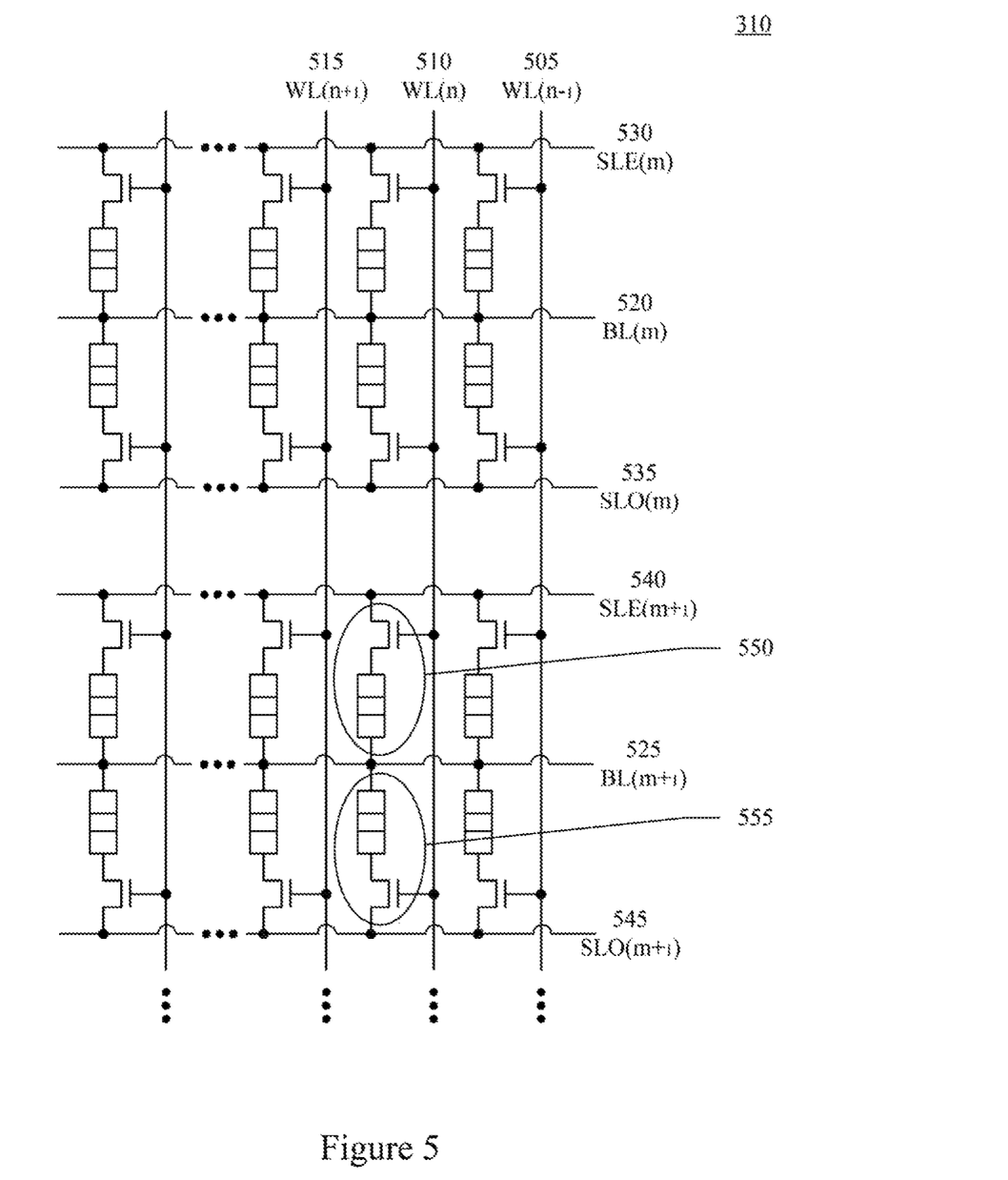
FIG. 5 shows a circuit diagram of a MRAM memory cell array, in accordance with embodiments of the present technology.

Referring now to FIGS. 3, 4 and 5, the control circuit 360 can be configured to cause the word line driver to apply a predetermined voltage to a select word line. The control circuit 360 can also cause the bit line and source line driver circuit 340 to apply predetermined write voltages to the bit lines and source lines to write data to cells in the selected word. The magnetic polarity, and corresponding logic state, of the free layer of the MTJ can be changed to one of two states depending upon the direction of current from through the MTJ.

In a first example, the control circuit 360 can be configured to control the word line driver and the bit line and source line driver circuit 340, in accordance with Table 1. To read data from a given memory cell 550, the respective bit line BL(m+1) 525 can be biased at a bit line read potential (e.g., $V_{BLR}$), the respective one of the pair of source lines SLE(m+1) 540 can be biased at ground (e.g., 0) and the other one of the pair of source lines SLO(m+1) 545 can also be biased at the bit line read potential (e.g., $V_{BLR}$) or other potential that will prevent current from flowing in the other one of the pair of source lines. When the respective word line WL(n) 510 is biased at a word line read potential (e.g., $V_{WLR}$) a current proportional to the resistance of the MTJ of the cell 550 will flow from the respective bit line BL(m+1) to the respective one of the pair of source lines SLO(m+1) 545. However, the other one of the pair of source lines SLO(m+1) 545 can be biased at the bit line read potential (e.g., $V_{BLR}$) or other appropriate potential to prevent current from flowing in the respective bit line BL(m+1) 525 proportional to the resistance of the MTJ of the other cell 555 coupled to the bit line BL(m+1) 525. In such case, the current sensed on the respective bit line BL(m+1) 525 can indicate the state of the selected cell 550.

To write a logic '0' state to the given memory cell 550, the respective bit line BL(m+1) 525 can be biased at a bit line write potential (e.g., $V_{BLW}$), the respective one of the pair of source lines SLE(m+1) 540 can be biased at ground (e.g., 0), and the other one of the pair of source lines SLO(m+1) 545 can also be biased at the bit line write potential (e.g., $V_{BLW}$) or other potential that will prevent the cell 555 on the other one of the pair of source lines from being written to. When the respective word line WL(n) 510 is biased at a word line write potential (e.g., $V_{WLW}$) a resulting current flowing through the MTJ of the cell 550 will cause the free magnetic layer into a state corresponding to a logic '0' state. However, the other one of the pair of source lines SLO(m+1) 545 biased at the bit line write potential (e.g., $V_{BLR}$) or other appropriate potential voltage will prevent current from flowing through the MTJ of the other cell 555 coupled to the other one of the pair of bit lines BL(m+1) 525.

To write a logic '1' state to the given memory cell 550, the respective bit line BL(m+1) 525 can be biased at ground (e.g., 0), the respective one of the pair of source lines SLE(m+1) 540 can be biased at a source line write potential (e.g., $V_{SLW}$), and the other one of the pair of source lines SLO(m+1) 545 can be biased at ground (e.g., 0). When the respective word line WL(n) 510 is biased at a word line write potential (e.g., $V_{WLW}$) a resulting current flowing through the MTJ of the cell 550 will cause the free magnetic layer into a state corresponding to a logic '1' state.

TABLE 1

| | SLE (m) | SLO (m) | SLE (m + 1) | SLO (m + 1) | BL (m) | BL (m + 1) | WL (n) |
|---|---|---|---|---|---|---|---|
| Standby | 0 | 0 | 0 | 0 | 0 | 0 | 0 |
| Read | 0 | 0 | 0 | $V_{BLR}$ | 0 | $V_{BLR}$ | $V_{WLR}$ |
| Write 0 | 0 | 0 | 0 | $V_{BLW}$ | 0 | $V_{BLW}$ | $V_{WLW}$ |
| Write 1 | 0 | 0 | $V_{SLW}$ | 0 | 0 | 0 | $V_{WLW}$ |

In another example, the control circuit 360 can be configured to control the word line driver circuit 330 and the bit line and source line driver circuit 340 in accordance with Table 2 to read and write data to and from the memory cell array 310. To read data from a given memory cell 550, the respective bit line BL(m+1) 525 can be biased at ground (e.g., 0), the respective one of the pair of source lines SLE(m+1) 540 can be biased at a bit line read potential (e.g., $V_{BLR}$) and the other one of the pair of source lines SLO(m+1) 545 can also be biased at ground (e.g., 0). When the respective word line WL(n) 510 is biased at a word line read potential (e.g., $V_{WLR}$) a current proportional to the resistance of the MTJ of the given cell 550 will flow from the respective one of the pair of source lines SLE(m+1) 545 to the respective bit line BL(m+1). In such case, the current sensed on the respective source line SLE(m+1) 545 can indicate the state of the selected cell 550.

To write a logic '0' state to the given memory cell 550, the respective bit line BL(m+1) 525 can be biased at a bit line write potential (e.g., $V_{BLW}$), the respective one of the pair of source lines SLE(m+1) 540 can be biased at ground (e.g., 0), and the other one of the pair of source lines SLO(m+1) 545 can also be biased at the bit line write potential (e.g., $V_{BLW}$) or other potential that will prevent the cell 555 on the other one of the pair of source lines from being written to. When the respective word line WL(n) 510 is biased at a word line write potential (e.g., $V_{WLW}$) a resulting current flowing through the MTJ of the cell 550 will cause the free magnetic layer into a state corresponding to a logic '0' state. However, the other one of the pair of source lines SLO(m+1) 545 biased at the bit line write potential (e.g., $V_{BLR}$) or other appropriate potential voltage will prevent current from flowing through the MTJ of the other cell 555 coupled to the respective bit lines BL(m+1) 525.

To write a logic '1' state to the given memory cell 550, the respective bit line BL(m+1) 525 can be biased at ground (e.g., 0), the respective one of the pair of source lines SLE(m+1) 540 can be biased at a source line write potential (e.g., $V_{SLW}$), and the other one of the pair of source lines SLO(m+1) 545 can be biased at ground (e.g., 0). When the respective word line WL(n) 510 is biased at a word line write potential (e.g., $V_{WLW}$) a resulting current flowing through the MTJ of the cell 550 will cause the free magnetic layer into a state corresponding to a logic '1' state.

TABLE 2

| | SLE (m) | SLO (m) | SLE (m + 1) | SLO (m + 1) | BL (m) | BL (m + 1) | WL (n) |
|---|---|---|---|---|---|---|---|
| Standby | 0 | 0 | 0 | 0 | 0 | 0 | 0 |
| Read | 0 | 0 | $V_{BLR}$ | 0 | 0 | 0 | $V_{WLR}$ |
| Write 0 | 0 | 0 | 0 | $V_{BLW}$ | 0 | $V_{BLW}$ | $V_{WLW}$ |
| Write 1 | 0 | 0 | $V_{SLW}$ | 0 | 0 | 0 | $V_{WLW}$ |

The above described read and write operations can be extended to embodiments wherein three or more columns of memory cells are coupled to a respective bit line, by counter biasing the one or more unselected source lines as appropriate.

Embodiments of the present technology advantageously reduce the number of bit lines in the memory cell array. In accordance with embodiments of the present technology, the one or more unselected source lines for the respective selected bit line can be counter biased to read from a given memory cell and writing a '0' state to the given memory cell, for bit line sense configurations. In source line sense configurations, the one or more unselected source lines for the respective bit line can be counter biased for writing a '0' state to the given memory cell. By reducing the number of bit lines, the pitch of the bit lines (e.g., bit line width and/or spacing between the bit lines) can advantageously be increased, Increasing the width of the bit lines can advantageously reduce the resistance in the bit lines. However, it may be advantageous to compensate for the reduction in bit line resistance so that the resistance of the bit lines and source lines more closely match each other. By reducing the number of bit lines, the density of the memory cells in the array can also be advantageously increased. By reducing the number of bit lines, the length of the word lines in the memory cell array can also be advantageously reduced, which can also advantageously reduce the resistance in the word lines.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A memory device comprising:
   a plurality of memory cells arranged in a plurality of rows and a plurality of columns, wherein each memory cell includes a Magnetic Tunneling Junction (MTJ) and a transistor, wherein a drain of the transistor is coupled to a first terminal of the MJT;
   a plurality of bit lines, wherein each bit line is coupled to a second terminal of the MTJs of the memory cells in two or more respective columns of the memory cells;
   a plurality of source lines, wherein each source line is coupled to a source of the transistors of the memory cells in a respective column of the memory cells;
   a plurality of word lines, wherein each word line is coupled to a gate of the transistors of the memory cells in a respective row of the memory cells; and
   a control circuit configured to apply corresponding biases to a select word line, the plurality of bit lines and the plurality source lines to write data in parallel to cells in the select word line, including biases to a select bit line and a select source line coupled to the select hit line, and to apply a corresponding counter bias to one or more other source lines coupled to the select bit line to write a given value to a given memory cell.

2. The memory device of claim 1, wherein the control circuit is further configured to:
   apply a word line write voltage to the select word line;
   apply a bit line write voltage to the select hit line;
   apply a ground voltage to the select source line;
   apply the bit line write voltage to the one or more other source lines coupled to the select bit line; and
   wherein a '0' state is written to the given memory cell.

3. The memory device of claim 2, wherein the control circuit is further configured to:
   apply a word line write voltage to the select word line;
   apply a ground voltage to the select bit hue;
   apply a source line write voltage to the select source line;
   apply the ground voltage to the one or more other source lines coupled to the select bit line; and
   wherein a '1' state is written to the given memory cell.

4. The memory device of claim 1, wherein the control circuit is further configured to apply corresponding biases to the select word line, the select bit line and the select source line coupled to the select bit line, and to apply a corresponding counter bias to one or more other source lines coupled to the select bit line to read the given memory cell from the select bit line.

5. The memory device of claim 4, wherein the control circuit is further configured to:
   apply a word line read voltage to the select word line;
   apply a bit line read voltage to the select bit line;
   apply a ground voltage to the select source line; and
   apply the bit line read voltage to the one or more other source lines coupled to the select bit line.

6. The memory device of claim 1, wherein the control circuit is further configured to:
   apply a word line read voltage to the select word line;
   apply aground voltage to the select bit line;
   apply a source line read voltage to the select source line;
   apply the ground voltage to the one or more other source lines coupled to the select bit line; and
   wherein the given memory cell is read from the select bit line.

7. The memory device according to claim 1, wherein the plurality of memory cells comprise, a plurality of spin torque magnetoresistive memory cells.

8. The memory device according, to claim 1, wherein the plurality of bit lines and the plurality of source lines are substantially parallel to each other; and
   the plurality of word lines are substantially parallel to each other and substantially perpendicular to the plurality of bit lines and the plurality of source lines.

9. A Magnetoresistive Random-Access Memory (MRAM) comprising:
   a memory cell array including;
      a plurality of magnetoresistive memory cells arranged in a plurality of columns and rows;
      a plurality of word lines, wherein each word line is coupled to a corresponding row of the magnetoresistive memory cells;
      a plurality of bit lines, wherein each bit line is coupled to a first one and a second one of a pair of columns of the magnetoresistive memory cells; and
      a plurality of pairs of source lines, wherein a first one of each pair of source lines is coupled to corresponding first ones of the pair of columns of the magnetoresistive memory cells and a second one of each pair source lines is coupled to corresponding second ones of the pair of columns of the magnetoresistive memory cells; and
   a control circuit coupled to memory cell array, wherein the control circuit is configured bias a select word line, bias the plurality of bit lines, bias the first ones of the pairs of source lines and counter bias the second one of the pairs of source line relative to the first one of the pairs of source lines to access magnetoresistive memory cell in the select word line.

10. The MRAM of claim 9, wherein the control circuit is further configured to:
    bias the select word line at a word line write voltage;
    bias a given one of the bit lines at a bit line write voltage;
    bias a corresponding one of the first source lines at a ground voltage; and
    bias a corresponding one of the second source lines at the bit line write voltage, wherein a '0' state is written to a given memory cell.

11. The MRAM of claim 10, wherein the control circuit is further configured to:
    bias the select word line at a word line write voltage;
    bias a given one of the bit line at a ground voltage;
    bias a corresponding one of the first source lines at a source line write voltage; and
    bias a corresponding one of the second source lines at the ground voltage, wherein a '1' state is written to the given memory cell.

12. The MRAM of claim 9, wherein the control circuit is further configured to:
    bias the select word line at a word line read voltage;
    bias a given one of the bit line a bit line read voltage;
    bias a corresponding one of the first source lines at a ground voltage; and
    bias a corresponding one of the second source lines at the bit line read voltage, wherein a state of a given memory cell is read from the corresponding one of first source line.

13. The MRAM of claim 9, wherein the control circuit is further configured to:
    bias the select word line at a word line read voltage;
    bias a given one of the bit line a ground voltage;
    bias a corresponding one of the first source lines at a source line read voltage; and
    bias a corresponding one of the second source lines at the ground voltage, wherein at state of the given memory cell is read from the bit line.

14. The MRAM according to claim 9, wherein the plurality of magnetoresistive memory cells comprise, a plurality of spin torque magnetoresistive memory cells.

15. The MRAM according to claim 14, wherein the plurality of spin torque magnetoresistive memory cells each comprise, a pillar including:
- one or more seed layers;
- one or more synthetic antiferromagnetic layers;
- one or more reference magnetic layers;
- one or more magnetic tunneling barrier layers;
- one or more free magnetic layers;
- one or more non-magnetic spacer layers;
- one or more perpendicular polarizer layers;
- one or more capping layers; and
- one or more hard mask layers.

16. A method of accessing a Magnetoresistive Random-Access Memory (MRAM) comprising:
- biasing a selected word line coupled to a row of a plurality of Magnetic Tunnel Junction (MTJ) memory cells including a given MTJ memory cell;
- biasing a plurality of bit lines in parallel, including biasing a selected bit line coupled to a first and a second column of the plurality of MTJ memory cells, wherein the first column of the plurality of MTJ memory cells, includes the given MTJ memory cell; and
- biasing a plurality of source lines in parallel, including a bias of a selected source line coupled to the first column of the plurality of MTJ memory cells including the given MTJ memory cell, and a counter bias of a selected source line coupled to the second column of the plurality of MTJ memory cells.

17. The method of accessing the MRAM of claim 16, including writing a '0' state to the given MTJ memory cell comprising:
- applying a word line write voltage to the selected word line coupled to the row of MTJ memory cells including the given MTJ memory cell;
- applying a bit line write voltage to, the selected lit line coupled to the first and the second columns of the plurality of MTJ memory cells;
- applying a ground voltage to the selected source line coupled to the first column of the plurality of MTJ memory cells including the given MTJ memory cell; and
- applying the bit line write voltage to the selected source line coupled to the second column of the plurality of MTJ memory cells.

18. The method of accessing the MRAM of claim 17, including writing a '1' state to the given MTJ memory cell comprising:
- applying the word line write voltage to the selected word line coupled to the row of MTJ memory cells including the given MTJ memory cell;
- applying the ground voltage to the selected hit line coupled to the first and the second columns of the plurality of MTJ memory cells;
- applying a source line write voltage to the selected source line coupled to the first column of the plurality of NM memory cells including the given MTJ memory cell; and
- applying the ground voltage to the selected source line coupled to the second column of the plurality of MTJ memory cells.

19. The method of accessing the MRAM of claim 18, including reading a current state of the given MTJ memory cell comprising:
- applying a word line read voltage to the selected word line coupled to the row of the plurality of MD memory cells including the given MTJ memory cell;
- applying a bit line read voltage to the selected bit line coupled to the first and the second columns of the plurality of MTJ memory cells;
- applying the ground voltage to the selected source line coupled to the first column of the plurality of MTJ memory cells including the given MTJ memory cell;
- applying the bit line read voltage to the selected source line coupled to the second column of the plurality of MTJ memory cells; and
- sensing the selected source line coupled to the first column of the plurality of MTJ memory cells to determine the current state of the given MD memory cell.

20. The method of accessing the MRAM of claim 18, including reading a current state of the given MTJ memory cell comprising:
- applying a word line read voltage to the selected word line coupled to the row of the plurality of MD memory cells including the given MTJ memory cell;
- applying the ground voltage to the selected bit line coupled to the first and the second columns of the plurality of MTJ memory cells;
- applying a source line read voltage to the selected source line coupled to the first column of the plurality of MD memory cells including the given MIST memory cell;
- applying the ground voltage to the selected source line coupled to the second column of the plurality of MTJ memory cells; and
- sensing the selected bit line coupled to the first and the second columns of the plurality of MTJ memory cells to determine the current state of the given MTJ memory cell.

* * * * *